United States Patent [19]

Sakai

[11] Patent Number: 4,772,859

[45] Date of Patent: Sep. 20, 1988

[54] MICROWAVE TEMPERATURE COMPENSATED CASCADABLE AMPLIFIER FOR FIBER OPTICAL RECEIVER

[75] Inventor: Ryoichi Sakai, Yokohama, Japan

[73] Assignee: Tektronix, Inc., Beaverton, Oreg.

[21] Appl. No.: 58,011

[22] Filed: Jun. 4, 1987

[51] Int. Cl.[4] .............................................. H03F 3/04
[52] U.S. Cl. ...................................... 330/308; 330/311
[58] Field of Search .............................. 330/308, 311; 250/214 A, 214 AG; 455/619

[56] References Cited

U.S. PATENT DOCUMENTS 4,713,841 12/1987 Porter .................................. 455/619

Primary Examiner—Gene Wan
Attorney, Agent, or Firm—Francis I. Gray; William O. Geny; Peter J. Meza

[57] ABSTRACT

A temperature compensated amplifier network for a fiber optical receiver includes a photodiode having an optical input and a current output, and a cascadable transimpedance amplifier having N stages, each stage having a common base-emitter voltage. An emitter-follower transistor is coupled to the last stage of the transimpedance amplifier network and has a base-emitter voltage of the same magnitude but of opposite polarity from the base-emitter voltage of each of the amplifier stages. Any DC drift of the amplifier stages is therefore offset by a compensating drift in the opposite direction by the output emitter-follower.

4 Claims, 1 Drawing Sheet

MICROWAVE TEMPERATURE COMPENSATED CASCADABLE AMPLIFIER FOR FIBER OPTICAL RECEIVER

BACKGROUND OF THE INVENTION

The following invention relates to an amplifier network for a fiber optical receiver having a temperature compensation feature.

Optical receivers which have an input from a strand of fiber optic cable and an output to a microwave transmission line are operated at a DC output level which may drift with ambient temperature. This drift is caused most often by the changes with temperature in the base-emitter voltage of the transistors powering the receiver. If high gain and wide bandwidth are required, it is especially difficult to design an accurate amplifier network having DC coupling capability in a relatively simple configuration.

SUMMARY OF THE INVENTION

The present invention provides a temperature compensated amplifier network for a fiber optical receiver. The network includes a photodiode having an optical input and a current output coupled to a transimpedance amplifier network having at least one stage with a base-emitter voltage VBE. The transimpedance amplifier includes a gain setting resister connected to its output which is connected to an emitter follower output transistor wherein the emitter-follower transistor has a base-emitter voltage of $-V_{BE}$.

There may be a plurality of stages of transimpedance amplifiers but each stage will have a base-emitter voltage of $V_{BE}$ and will include a gain setting resistor between each stage.

It is a principal object of this invention to provide a temperature compensated amplifier network for a fiber optical receiver having a DC coupled output.

A further object of this invention is to provide in a relatively simple configuration, a temperature compensated cascadable amplifier network having high current gain and wide bandwidth.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
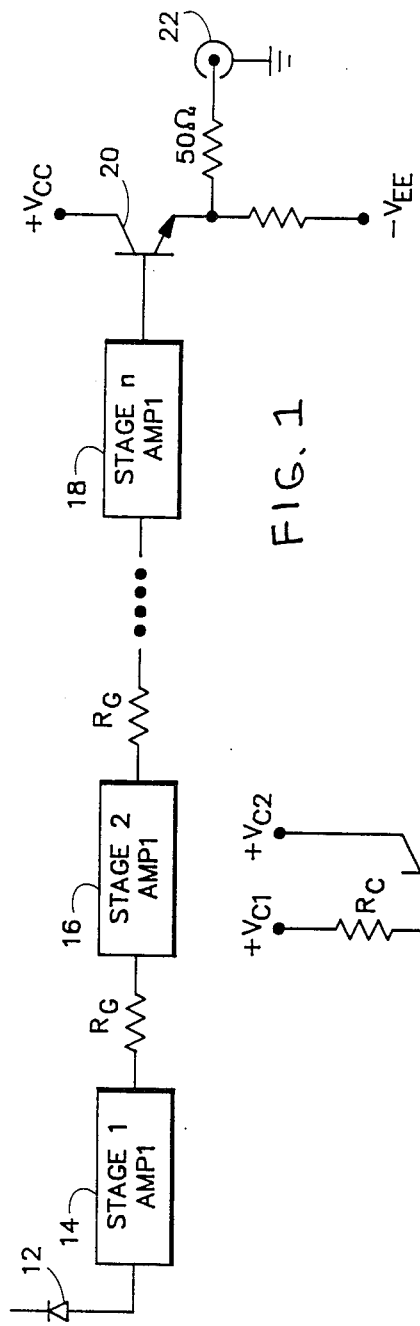
FIG. 1 is a block schematic diagram of the amplifier network of the present invention.

An amplifier network for a fiber optical receiver 10 includes a photodiode 12 which is biased by a relatively large voltage source $V_{BIAS}$ to provide a current output whenever light impinges on the photodiode 12. The output of the photodiode 12 is connected to an amplifier 14 which has a gain setting resistor $R_G$ connected to its output. The gain setting resistor $R_G$ is, in turn, connected to amplifier 16 which likewise will have a gain setting resistor $R_G$ in its output. The output of this gain setting resistor $R_G$ is connected to subsequent stages, the last of which is amplifier 18. The output of amplifier 18 is connected to an emitter-follower transistor 20. The emitter-follower transistor 20 provides a 50-ohm output to the terminal of a transmission line 22.

Figure 2:
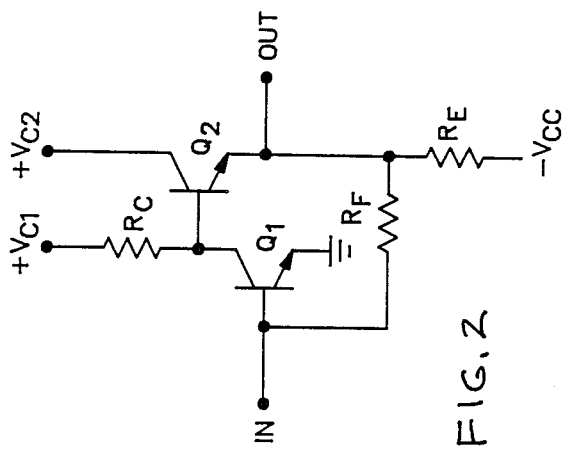
FIG. 2 is a schematic diagram of one of the transimpedence amplifier units which are cascaded as shown in FIG. 1.

Referring now to FIG. 2, each amplifier stage is a transimpedance amplifier having an input current and providing an output voltage. The output voltage at each stage is reconverted to an input current by gain setting resistor $R_G$. Each amplifier unit comprises a pair of transistors Q1 and Q2. Q1 has its emitter connected to ground and its base input connected to a feedback resistor $R_F$. The collector circuit is connected to the base of Q2 whose emitter is connected to the output and to a source of negative voltage $V_{CC}$ through resistor $R_E$. The emitter output of each amplifier is connected to the gain setting resistor $R_G$ and gain is therefore determined by the ratio of $R_F$ to $R_G$.

The base emitter voltage $V_{BE}$ is the same for each of the amplifiers 14, 16 and 18. This voltage varies with temperature by approximately $-2$ millivolts per degree centigrade. The emitter-follower output transistor 20 includes a base emitter voltage of $-V_{BE}$ which compensates for any drift in the base emitter voltage of amplifier stages 14, 16 and 18 caused by changes in temperature.

Since each of the amplifier stages 14, 16 and 18 are identical, as many stages may be used as are needed to provide high gain and/or high bandwidth. High bandwidth is achieveable if more stages are used with less gain per stage. The bias voltage for the photodiode 12 should be high enough so that current is insensitive to changes in $V_{BE}$. $V_{BE}$ can therefore float without appreciably affecting the current gain in each amplifier stage.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A temperature compensated amplifier network for a fiber optical receiver comprising:
   (a) a photodiode having an optical input and a current output;
   (b) a transimpedance amplifier having a current input and a voltage output, the current input being coupled to the current output of said photodiode, the voltage of the voltage output including a base-emitter voltage; and
   (c) an emitter-follower transistor having a base and an emitter, the base being coupled to the voltage output of said transimpedance amplifier, the emitter forming a DC coupled temperature compensated output, whereby the base-emitter voltage of said emitter-follower transistor substantially compensates for the base-emitter voltage output of said transimpedance amplifier.

2. A temperature compensated amplifier network for a fiber optical receiver as in claim 1 wherein the transimpedance amplifier comprises first and second transistors, each having a base, a collector, and an emitter, and a feedback resistor, the collector of the first transistor being coupled to the base of the second transistor and to a source of bias current, the emitter of the first transistor being coupled to a source of reference voltage, the collector of the second transistor being coupled to a power supply voltage, one end of the feedback resistor being coupled to the base of the first transistor to form a current input, and the other end of the feedback resistor being coupled to the emitter of the second transistor to form a voltage output.

3. A temperature compensated amplifier network for a fiber optical receiver comprising:

(a) a photodiode having an optical input and a current output;

(b) a plurality of transimpedance amplifiers each having a current input and a voltage output, the voltage of the current input being substantially equal to a base-emitter voltage, the voltage of the voltage output including the base-emitter voltage;

(c) one or more gain setting resistors, each gain setting resistor coupling the voltage output of one of the transimpedance amplifiers to the current input of another of the transimpedance amplifiers to form a series of coupled transimpedance amplifiers, the current output of said photodiode being coupled to the current input of the first transimpedance amplifier in the series; and (d) an emitter-follower transistor having a base and an emitter, the base being coupled to the voltage output of the last transimpedance amplifier in the series, the emitter forming a DC coupled temperature compensated output, whereby the base-emitter voltage of said emitter-follower transistor substantially compensates for the base-emitter voltage of the voltage output of the last transimpedance amplifier in the series.

4. A temperature compensated amplifier network for a fiber optical receiver as in claim 3 wherein each of the transimpedance amplifiers comprise first and second transistors, each having a base, a collector, and an emitter, and a feedback resistor, the collector of the first transistor being coupled to the base of the second transistor and to a source of bias current, the emitter of the first transistor being coupled to a source of reference voltage, the collector of the second transistor being coupled to a power supply voltage, one end of the feedback resistor being coupled to the base of the first transistor to form a current input, and the other end of the feedback resistor being coupled to the emitter of the second transistor to form a voltage output.

* * * * *